ized Patent No.: US 7,763,870 B2
Date of Patent: Jul. 27, 2010

(12) United States Patent
Ehm et al.

(10) Patent No.: US 7,763,870 B2
(45) Date of Patent: Jul. 27, 2010

(54) OPTICAL SYSTEM FOR RADIATION IN THE EUV-WAVELENGTH RANGE AND METHOD FOR MEASURING A CONTAMINATION STATUS OF EUV-REFLECTIVE ELEMENTS

(75) Inventors: Dirk Heinrich Ehm, Aalen (DE); Hermann Bieg, Huettlingen (DE); Hans-Juergen Mann, Oberkochen (DE); Stephan Muellender, Aalen (DE); Johannes Hubertus Josephina Moors, Helmond (NL); Bastiaan Theodoor Wolschrijn, Abcoude (NL)

(73) Assignees: Carl Zeiss SMT AG, Oberkochen (DE); ASML Netherlands B.V., Veldhoven (NL)

( * ) Notice: Subject to any disclaimer, the term of this patent is extended or adjusted under 35 U.S.C. 154(b) by 360 days.

(21) Appl. No.: 11/855,849

(22) Filed: Sep. 14, 2007

(65) Prior Publication Data
US 2008/0315134 A1 Dec. 25, 2008

(30) Foreign Application Priority Data
Sep. 14, 2006 (EP) ................................. 06019265

(51) Int. Cl.
*H05G 2/00* (2006.01)
(52) U.S. Cl. ............................ 250/504 R; 250/493.1; 355/53
(58) Field of Classification Search ........................ None
See application file for complete search history.

(56) References Cited
U.S. PATENT DOCUMENTS 6,392,738 B1 * 5/2002 van de Pasch et al. ......... 355/30
6,781,673 B2 * 8/2004 Moors et al. .................. 355/76
6,980,281 B2 * 12/2005 Moors et al. .................. 355/67
7,245,357 B2 * 7/2007 Van Zwet et al. ............. 355/72
7,405,417 B2 * 7/2008 Stevens et al. ............ 250/504 R
7,414,700 B2 * 8/2008 Van Herpen et al. .......... 355/53
7,462,850 B2 * 12/2008 Banine et al. ............ 250/504 R
2005/0133727 A1    6/2005 Banine et al.
2007/0138414 A1 *  6/2007 Stevens et al. ............ 250/504 R

OTHER PUBLICATIONS

Grunow et al.: "Rates and mechanisms of optic contamination in the EUV engineering test stand" in Database Compendex Engineering Information, Inc., New York, NY, US (Database accession No. E2003407655918) and in Proceedings of SPIE—the International Society for Optical Engineering, vol. 5037 I, pp. 418-428.

* cited by examiner

*Primary Examiner*—David A Vanore
(74) *Attorney, Agent, or Firm*—Sughrue Mion, PLLC

(57) ABSTRACT

An optical system for radiation in the EUV wavelength range, in particular a projection exposure apparatus, having at least one vacuum vessel, including: at least one EUV-reflective optical element arranged in an optical path, and a holder which includes at least one sample element, the sample element having an optical surface which is exposed to incident EUV-radiation outside of the optical path, the sample element being sensitive to chemical alterations under influence of the incident EUV-radiation which also affect the optical element. The optical system further includes at least one detection unit for online detection of the contamination status of the sample element during exposure of the sample element to the incident EUV-radiation.

18 Claims, 3 Drawing Sheets

US 7,763,870 B2

OPTICAL SYSTEM FOR RADIATION IN THE EUV-WAVELENGTH RANGE AND METHOD FOR MEASURING A CONTAMINATION STATUS OF EUV-REFLECTIVE ELEMENTS

CROSS-REFERENCE TO RELATED APPLICATIONS

This application claims priority under 35 U.S.C. §119(a) to European Patent Application No. 06019265.5, filed on Sep. 14, 2006, the entire contents of which are hereby incorporated by reference.

FIELD OF THE INVENTION

The present invention relates to an optical system for radiation in the EUV wavelength range, in particular a projection exposure apparatus, having at least one vacuum vessel, wherein the vacuum vessel comprises: at least one EUV-reflective optical element arranged in an optical path, and a holder which comprises at least one sample element, the sample element having an optical surface which is exposed to incident EUV-radiation outside of the optical path, the sample element being sensitive to chemical alterations under influence of the incident EUV-radiation which also affect the optical element. The invention also relates to a method for measuring a contamination status of EUV-reflective elements in such an optical system.

BACKGROUND OF THE INVENTION

Lithography exposure apparatuses for the EUV wavelength range (from about 5 nm to about 20 nm) generally comprise a light source, an illumination system for homogeneous illumination of a pattern arranged on a mask with light from the light source, and a projection system for imaging the pattern onto a photo-sensitive substrate. In general, EUV-reflective optical components arranged in such lithography exposure apparatuses are contaminated during use, e.g. by hydrocarbon molecules, the presence of which cannot be avoided even though such apparatuses are operated under vacuum conditions. Moreover, the optical components may be further contaminated by carbon-containing materials due to radiation-induced cracking of hydrocarbon molecules.

Contaminations have an adverse effect on the EUV-reflective optical components, such as mirror elements, as they affect their optical properties, in particular their reflectance, thus leading to increased absorption, and may also introduce wavefront errors. This leads to a short lifetime of these optical elements and a degradation of the overall optical performance of the lithography exposure apparatus.

For taking appropriate measures against contaminations, e.g. replacing optical elements as soon as a certain degree of degradation has been exceeded, the contamination status of the optical components in such lithography systems has to be monitored. For this purpose, a considerable number of measurement methods have been described in the literature. All of these methods are faced with the problem that a contamination measurement should not affect the optical performance of the optical system and, in particular, the vacuum conditions in the system should not be disturbed.

One possibility for performing a contamination measurement is described in detail in EP 1 452 891 A1, which is incorporated herein by reference in its entirety. Therein, a measuring device is described which projects radiation on the optical surface of a mirror component to be inspected inside the projection apparatus, the measuring device subsequently measuring a property of the radiation reflected therefrom in a radiation receiver device. In dependence of at least one property of the reflected radiation, a contamination property of the optical surface is subsequently determined in a processor unit. For this method to work, an additional radiation source and receiver need to be positioned in the optical system to project the radiation to the optical surface and to inspect the radiation reflected therefrom. Moreover, the radiation projected to the optical surface for the measurement may adversely affect the imaging conditions of the exposure apparatus.

In U.S. Pat. No. 6,980,281 B2, incorporated herein by reference in its entirety, a lithographic apparatus is disclosed, in which a beam of radiation passes along a beam path to a substrate. An exchangeable aperture screen is inserted in the beam path to partially block out the beam from a remainder of the path onto the substrate. A sample surface is provided on the aperture screen, so that the sample surface receives a part of the beam that is not passed along the remainder of the beam path. The sample surface is made of a material that is sensitive, under influence of radiation from the beam, to chemical alterations that also affect the optical element under influence of radiation from the beam. The sample surface is later analysed for chemical alterations after exposure to the beam. However, additional straylight may be generated during the measurement process by the radiation reflected from the sample surface, as, even though reflected away from the beam path, some of the radiation may return to the beam path through scattering at components present in the vacuum vessel outside of the beam path. Also, for a chemical analysis of the sample surface, the aperture screen has to be removed from the lithographic system. Consequently, no inspection of the sample surface is possible during the exposure process.

OBJECT OF THE INVENTION

It is an object of the invention to provide an optical system for the EUV-wavelength range and a corresponding contamination measuring method which allow for the determination of contamination properties of optical components in an optical system as described above in particular during the exposure process without causing degradation of the optical properties of the inspected optical components.

SUMMARY OF THE INVENTION

According to a first aspect, this object is achieved by an optical system as described above, wherein all of the EUV-radiation incident to the optical surface is absorbed by the holder and/or by the sample element.

In contrast to the state of the art described in U.S. Pat. No. 6,980,281 B2, the present invention proposes—by absorbing all of the radiation incident to the optical surface—to avoid degradations of the performance of the optical system due to straylight generated by the reflected radiation. Thus, no incident radiation can return to the optical path in which the imaging mirrors are arranged, i.e. the arrangement of the sample element and holder serves as a light trap. The term "all incident radiation" means that ideally 100% of the incident radiation is absorbed. However, due to practical limitations of the absorbing materials used, the above condition may also be attained when more than 95% of the incident radiation is absorbed.

The optical surface of the additional sample element reproduces the optical properties of the reflective elements as precisely as possible and therefore serves as a test element ("witness mirror"), i.e. it shows the same contamination status as the imaging mirrors even though it does not take part in the projection process. By inspecting the optical surface of such a witness mirror, the contamination status of the imaging mirrors can be determined without having to perform a direct measurement on these mirrors, which may adversely affect their imaging properties and could lead to a deterioration of the performance of the overall optical system.

For reproducing the optical properties of EUV-reflective elements (also referred to as imaging mirrors in the following), which are commonly coated with a reflective multilayer coating, the sample element is in general also covered which such a coating, although not necessarily a reflective one, the reason being as follows: A reflective coating may be transformed to an absorptive coating simply by varying the thickness of an adaptation layer adjacent to the substrate at the bottom of the layer stack, the remaining layers being identical. However, as chemical alterations due to the incident radiation influence particularly the topmost layers of the layer stack, a sample element having an adsorptive multilayer coating may also be indicative of the contamination status of EUV-reflective elements.

The optical path of the exposure apparatus is defined by the radiation which is transmitted from the light source to the photosensitive substrate at the wafer plane. The EUV-radiation which is obstructed, e.g. blocked by aperture stops or other elements, and which does not reach the photosensitive substrate can be used to irradiate the sample element without affecting the performance of the system. Thus, the sample mirror is preferably arranged in an area in the optical system which is exposed to EUV radiation outside of the optical path, e.g. on an aperture stop serving as a holder.

According to a second aspect, an optical system is provided, wherein the holder is electrically conductive, and the sample element is connected to the holder in an electrically conductive way. Due to the irradiation of the sample element, secondary electrons are generated in its optically active volume. These electrons are transferred from the sample element to the holder which may be accessible from the outside of the vacuum vessel via a holding assembly being connected to a cable connection, such that a sample current corresponding to the number of electrons can be determined outside the optical system. The sample current is indicative of the contamination status of the optical element. It is preferred when the holder is in operable connection—possibly via further conductive elements—with a voltage meter or ammeter serving as a detection unit for measuring the photoelectron current due to the incident EUV-radiation. An electrical connection between the holder and the sample element may be advantageously achieved when the sample element forms an integral part of the holder. In case that several sample elements are placed on the holder and a separate in-situ characterization of each element is required, the conductive holder must comprise one or more electrically isolating portions which separate the sample elements from each other, such that the current through each of the elements can be measured separately.

According to a third aspect, an optical system is provided, further comprising at least one detection unit for online detection of the contamination status of the sample element during exposure of said sample element to said incident EUV-radiation. Such a detection may be realized e.g. by an online measurement of the photoelectron current, as described with respect to the second aspect of the invention.

In a preferred embodiment, the optical surface reflects all of said incident EUV-radiation to the detection unit for measuring the intensity of the reflected EUV radiation. In such a way, an online detection of the reflectivity and, in particular, the change of the reflectivity of the sample element during exposure to the EUV-radiation is possible, thus leading to an online determination of its contami-nation status. The detection unit (optical detector) may be arranged on the holder or at another location in the optical system. The detection unit normally absorbs essentially all of the EUV radiation which impinges on it, such that the generation of straylight which may return to the optical path can be avoided.

It will be appreciated that an optical system according to the second or third aspect of the invention may be advantageously combined with an optical system according to the first aspect of the invention. The contamination status of the sample element may then be inspected in-situ through measurement of the photoelectron current and/or its reflectivity and/or by removing the holder from the optical system and subsequently performing an ex-situ measurement.

In a preferred embodiment, the optical surface reflects all of the incident EUV-radiation to the holder. In this case, the sample element is a reflective element, i.e. ideally all of the incident radiation is reflected by the optical surface. Directing the reflected radiation to the holder may be achieved by choosing an appropriate shape of the optical surface, e.g. a parabolic shape or a plane shape, and by appropriately arranging the optical surface with respect to the incident radiation, i.e. by forming an appropriate angle between the optical surface and the holder.

In a further preferred embodiment, the optical surface absorbs all of the incident radiation. In this case, the sample element is an absorptive element which—theoretically—absorbs all of the incident radiation. By absorbing the EUV-radiation, the functionality as a light trap can be easily achieved. As described above, although the properties of the optical surface of the sample element should be chosen as close as possible to the properties of the mirror elements which take part in the projection process, an absorptive multilayer system may meet this requirement. In case that a small part of the radiation is still reflected from the absorptive element, the sample element must be arranged in such a way that the reflected radiation is directed to the holder. The sample element has a high thermal conductivity and transfers the absorbed radiation to the holder, which is itself thermally conductive.

In a highly preferred embodiment, the sample element is detachably attached to the holder, preferably by clamping. In general, one or more sample elements are attached to the holder in an exchangeable way such that they can be easily removed or replaced. In general, the holder also has an optical functionality, e.g. it may serve as an aperture stop for the radiation in the optical path of the system.

In another highly preferred embodiment, the holder or the witness mirror itself is removable from the vacuum vessel without perturbing vacuum conditions of the vacuum vessel, preferably by a dedicated handling mechanism, i.e. aperture or witness mirror transfer mechanism. Accessibility of the sample element for easy exchange without influencing the vacuum conditions in the vacuum vessel can be achieved e.g. by a dedicated handling system by which it is possible to replace the sample element without venting the principal vacuum vessel of the lithography apparatus. This can be done e.g. by using a mechanism which is commonly referred to as a load lock and which allows one to separate a small volume containing the sample element from the remainder of the vacuum vessel. The vacuum conditions of this isolated volume are then broken and the sample element is subsequently removed from the vacuum vessel. The sample element can then be inspected for contaminations outside of the optical system by any suitable inspecting method. After the inspection, either the same sample element or a new, i.e. not contaminated, sample element is positioned in the isolated volume. After a subsequent evacuation of the isolated volume, the latter is finally reconnected to the vacuum vessel via a vacuum valve.

In a further highly preferred embodiment, the sample element is positioned under a tilt angle with respect to the incident radiation, which constitutes a simple way to direct the reflected radiation to the holder.

In a further advantageous embodiment, the sample element comprises a multilayer coating with a structure which corresponds to the structure of a multilayer coating of the least one EUV-reflective optical element. For enhancing reflectivity, EUV-reflective elements are generally coated with multilayer stacks. As the sample element should reproduce the optical properties of the surfaces of the mirror elements, covering the sample element with a coating which is identical to at least one imaging mirror's coating allows one to reproduce the contamination status of that particular mirror, provided that the sample element is irradiated with approximately the same radiation intensity. It will be appreciated that in general, the multilayer coatings of the sample elements have to be inspected before use and their optical properties have to be characterized, as the coatings of the sample elements have to be produced with the same precision which is required for the coatings of the mirror elements.

In a further preferred embodiment, the holder is selected from the group consisting of: a vacuum separation valve and an aperture stop. An aperture stop obstructs the optical path by blocking part of the radiation in an irradiated area, such an area thus being ideally suited for positioning the sample element. In a similar way, vacuum valves which separate different vacuum compartments from each other often provide such an irradiated area which is suited for placing a sample element. It will be appreciated that the contamination status of optical elements depends on the intensity of the incident radiation to which they are exposed. Consequently, when determining their contamination status, it is of advantage when the sample elements are exposed to a similar or identical radiation intensity, which is in general only possible when the sample elements are located close to the optical elements to be inspected.

In a further preferred embodiment, the sample element is located in or near a wafer plane, a reticle plane, or an aperture plane. In general, optical arrangements located in these planes are accessible from the outside of the vacuum vessel of the lithography system via locks etc., as these arrangements (wafer, reticle, aperture stops) need to be replaced during the projection exposure process. By arranging a sample element on such an exchangeable arrangement, it can be removed from the vacuum vessel without affecting the vacuum conditions therein.

In a further preferred embodiment, the optical system comprises at least one reference sample element which is not exposed to EUV-radiation, the reference sample element preferably being arranged outside an irradiated area on the holder. By using a reference sample element, the effects of light-induced contamination can be distinguished from the contaminations inside the vacuum vessel which are not generated by exposure to EUV-radiation.

The invention is further realized in a method for determining a contamination status of at least one EUV-reflective element arranged in a vacuum vessel in an optical path of an optical system, in particular a projection exposure apparatus, comprising the steps of: arranging a holder with at least one sample element and a reference sample element in the vacuum vessel, an optical surface of the sample element being located outside of the optical path, and the reference sample element being located outside of an irradiated area on the holder, comprising the steps of: exposing the sample element to incident EUV-radiation, measuring a contamination status of the exposed sample element and of the reference sample element using at least one inspection method, and comparing the contamination status of the exposed sample element with that of the reference sample element for determining a contamination status of the exposed sample element which is due to its exposure to radiation only. The contaminations generated in the vacuum environment which are not due to the exposure to EUV-radiation, e.g. due to outgassing components inside the vacuum vessel, are measured with the reference sample element. By comparing the chemical (and structural) alterations of the reference sample and the sample which is exposed to EUV-radiation, the contaminations which are due to the exposure to EUV-radiation of the sample element can be determined.

The process described above can be performed in-situ by using an appropriate measurement method, e.g. by reflectometry.

In a preferred variant, the holder is removed from the vacuum vessel after the exposure step without perturbing vacuum conditions of the vacuum vessel, e.g. by using a load lock as described above. In such a way, the contamination status of the sample element can be determined ex-situ, i.e. outside of the vacuum vessel of the optical system, thus allowing one to choose any inspection method known in the art, in contrast to in-situ measurements where the choice of the inspection method is constrained due to the limited space for arranging inspection systems inside the vacuum vessel.

In a preferred variant, the inspection method is at least one selected from the group consisting of: reflectometry, photocurrent measurement, surface analysis, XPS (X-ray photoelectron spectroscopy), AES (Auger electron spectroscopy), and SEM (Scanning Electron Microscopy). It is understood that the invention is not limited to the inspection methods described above, as other inspection methods may be applied as well.

Further features and advantages are stated in the following description of exemplary embodiments, with reference to the figures of the drawing which shows significant details, and are defined by the claims. Individual features can each be used singly, or several of them can be taken together in any desired combination, in order to implement desired variations.

BRIEF DESCRIPTION OF THE DRAWINGS

The schematic drawing shows an embodiment which is explained in the following description.

DETAILED DESCRIPTION OF PREFERRED EMBODIMENTS

Figure 1:
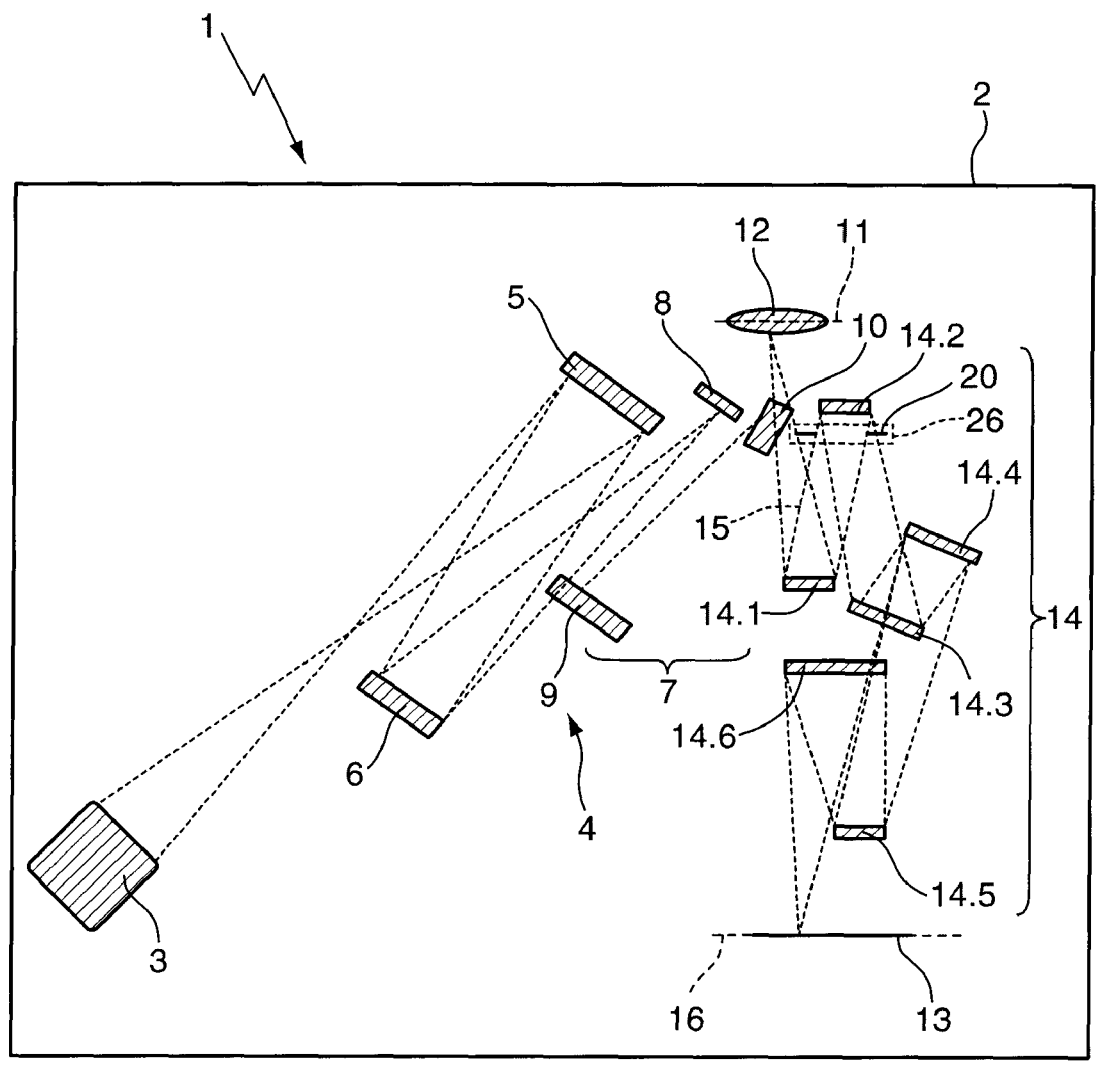
FIG. 1 shows an embodiment of a microlithography projection exposure apparatus according to the invention with an aperture stop having four sample elements the optical surfaces of which are exposed to incident EUV-radiation.

FIG. 1 shows a schematic representation of a microlithography projection exposure apparatus 1 for EUV-lithography which is construed for manufacturing highly integrated semiconductor devices. The projection exposure apparatus 1 comprises a vacuum vessel 2 which is operated under vacuum conditions during the exposure process. Inside of the vacuum vessel 2, a EUV-radiation source 3 (including collimator optics), an illumination system 4, and a projection system 14 are arranged, each in a dedicated vacuum compartment of the vacuum vessel 2 (not shown).

The illumination system 4 serves to generate a homogeneous radiation distribution from the EUV-light of the radiation source 3 in a first plane 11 of the apparatus 1 (also referred to as reticle plane). For this purpose, the illumination system 4 comprises, following the radiation source 3, a mirror with field raster elements as a first EUV-reflective element 5 and a mirror with pupil raster elements as a second EUV-reflective element 6. Following the first and second reflective elements 5, 6, a group 7 of three mirrors 8, 9, 10 are combined to form a telescope arrangement. The first mirror 8 and the second mirror 9 of the group of mirrors 7 are operated under normal incidence, whereas the third mirror 10 of the group 7, having negative refractive power, is operated under grazing incidence. The EUV-radiation is reflected from the grazing-incidence mirror 10 to the reticle plane 11, where a reflective mask 12 is arranged having a pattern (not shown) to be imaged in a reduced scale onto a photosensitive substrate 13 in a wafer plane 16.

For imaging the pattern from the mask 12 to the substrate 13, the projection system 14 comprises a plurality of six EUV-reflective elements 14.1 to 14.6, the optical function of which will not be described herein for the sake of simplicity. The projection system 14 further comprises an aperture stop 20 for delimiting an optical path 15 which is defined by the radiation which is transmitted from the radiation source 3 to the photosensitive substrate 13. The aperture stop 20 is located in the optical path 15 in front of the second EUV-reflective element 14.2 of the projection system 14 and is arranged in a load lock 26 which can be isolated from the remnant of the vacuum vessel 2 for removing the aperture stop 20 there from.

The EUV-reflective elements 5, 6, 8, 9, 10, 14.1 to 14.6 inside of the vacuum vessel 2 are subject to contaminations due to impurities, e.g. by hydrocarbon molecules, which cannot be avoided even though the vacuum vessel 2 is operated under vacuum conditions. For determining a contamination status of these elements, four EUV-reflective sample elements 21a to 21d are arranged equally spaced in a circumferential direction on the aperture stop 20 which serves as a holder for the sample elements 21a to 21d and is shown in detail in FIG. 2a.

The aperture stop 20 (NA-disc) determines the numerical aperture (NA) of the projection system 14 by choosing the diameter of a circular opening 23 in the center of the aperture stop 20 such that the desired value of the numerical aperture is attained. The circular opening 23 limits the optical path 15 (see FIG. 2b) by obstructing part of the EUV-radiation which is absorbed by the aperture stop 20 in a circular area 24 exposed to EUV radiation outside of the optical path 15, the outer limit of which is represented by a dashed line in FIG. 2a.

By arranging the four sample elements 21a to 21d in the irradiated annular area 24 outside of the optical path 15 and adjacent the circular opening 23, these are exposed to incident radiation 27 which is blocked from the optical path 15 by the aperture stop 20. Moreover, the sample elements 21a to 21d are positioned under a tilt angle with respect to the incident radiation 27. The radiation which is incident to the aperture stop 20 forms an angle $\alpha=8°$ with respect to a z-axis (of a z/y coordinate system) which coincides with an axis of revolution of the aperture stop 20. A normal vector 25 of the sample elements 21a to 21d forms an angle $\beta=50°$ with respect to the z-axis, such that the sample elements 21a to 21d are tilted with respect to the incident radiation 27 by an angle of $\beta-\alpha=42°$. Consequently, the radiation 27 incident to optical surfaces 21a', 21b' of the sample elements 21a to 21d is reflected away from the optical path 15 to the aperture stop 20 which absorbs the reflected radiation, the arrangement of the sample elements 21a to 21d therefore serving as a light trap. In order to efficiently absorb the reflected radiation while keeping the diameter of the aperture stop 20 as small as possible, the aperture stop 20 comprises an outer rim which protrudes in the z-direction. Those skilled in the art will appreciate that there exist a variety of ways for locating and shaping protrusions on the aperture stop 20 in order to efficiently absorb the reflected radiation.

Alternatively, the light trap functionality may also be realized in the following way: A multilayer coating of the sample elements 21a to 21d is chosen to be absorptive, i.e. in such a way that only a small portion of radiation, preferably no radiation at all, is reflected by the multilayer coating, i.e. the incident radiation is absorbed entirely by the sample elements 21a to 21d. This can be realized by a dedicated choice of a multilayer mirror stack. In the ideal case, i.e. when the incident EUV-radiation is completely absorbed, the normal vector of the sample elements 21a to 21d may be arranged also parallel to the incident radiation, as it is not necessary to reflect the radiation to the holder 20.

In any case, the optical surfaces of the sample elements 21a to 21d are chosen to correspond in their optical properties to the EUV-reflective elements 14.1 to 14.6 of the projection system 14, i.e. their multilayer reflection and antireflection (absorptive) coatings, respectively, have a comparable or identical structure. As the sample elements 21a to 21d are also operated under vacuum conditions and exposed to EUV-radiation, by determining their contamination status the contamination status of the EUV-reflective elements 14.1 to 14.6 can be determined.

For distinguishing the contaminations which are generated by the exposure of the sample elements 21a to 21d to EUV-radiation from those contaminations which are not caused by such a EUV-exposure, a reference sample element 22 is arranged on the aperture stop 20 outside of the irradiated area 24, not being irradiated by EUV-radiation. Consequently, when comparing the contamination status of the sample elements 21a to 21d with the contamination status of the reference element 22, the above distinction can be made.

The contamination status of the sample elements 21a to 21d may be determined either in-situ or ex-situ by applying appropriate inspection techniques (surface analysis etc.). A very effective way for an in-situ determination of the contamination status is achieved by connecting the sample elements 21a to 21d to the aperture stop 20 in an electrically conductive way, the aperture stop 20 being itself electrically conductive. In this case, an electrical current which is due to secondary electrons generated in the material of the sample elements 21a to 21d by exposure to EUV-radiation can be measured when aperture stop 20 is connected to a current measuring device 29 via a handling assembly (not shown) which is also electrically conducive. Therefore, by realizing an electrical contact between the surface of the sample elements 21a to 21d, the handling assembly, and the aperture stop 20, an in-situ study of the contamination and degradation status of the sample elements 21a to 21d can be achieved by measuring the sample current produced by the photoelectrons (mainly secondary electrons).

Alternatively or in addition, the contamination status of the sample elements 21a to 21d and consequently the contamination status of the EUV-reflective elements 14.1 to 14.6 can be determined ex-situ in the following way: First, the sample elements 21a to 21d and the reference sample element 22 are characterized in their optical properties, i.e. it is made sure that they meet the requirement of having an (almost) identical structure to that of the EUV-reflective optical elements. Then, the sample elements 21a to 21d and the reference sample element 22 are clamped to the aperture stop 20 by a spring assembly (not shown). In a following step, the aperture stop 20 with the sample elements 21a to 21d is arranged in the vacuum vessel 2 via the load lock 26, i.e. without perturbing the vacuum conditions inside. In a subsequent step, the projection exposure apparatus 1 is operated for projecting an image of a pattern arranged on the mask 12 onto the photosensitive substrate 13. During this exposure process, the sample elements 21a to 21d are irradiated by the EUV-radiation in the way described above. After a number of exposure steps has been performed, the aperture stop 20 is removed from the vacuum vessel 2 via the load lock 26 by a dedicated handling mechanism (not shown). The sample elements 21a to 21d and the reference sample element 22 are then removed from the aperture stop 20 and an ex-situ analysis of their contamination status is carried through by at least one surface inspection technique, e.g. reflectometry or classical surface analysis (XPS, AES, SEM, etc.).

In the above process, use can be made of the regular handling and storage equipment for the aperture stop 20. In particular, the exchange of the sample elements 21a to 21d can be performed whenever the exposure process requires an adaptation of the numerical aperture, i.e. the aperture stop 20 (with a numerical aperture of e.g. NA=0.15) has to be replaced by another one with a different numerical aperture. As the exchange of the aperture stop 20 is part of the regular lithography exposure process, no dedicated time frame for the contamination measurements is needed.

In short, the arrangement of the sample elements 21a to 21d on the aperture stop 20 fulfils two requirements: first, the sample elements 21a to 21d can be exchanged via the load lock 26 with relatively small effort without influencing the vacuum conditions in the vacuum vessel 2, i.e. without venting the entire vacuum vessel 2, and second, the imaging conditions in the lithography apparatus are not disturbed (e.g. by straylight, transmission loss, etc.), since the sample element arrangement 21a to 21d serves as a light trap.

It also has to be mentioned that the overexposed area on the aperture blade has to be made of a low outgassing material to prevent radiation induced outgassing products i.e. contamination of both all optical elements within the optical column as well as the witness mirrors on the aperture blade itself.

The person skilled in the art will appreciate that although the positioning of the sample elements 21a to 21d is described herein with respect to the aperture stop 20 which serves to determine the numerical aperture of the imaging system 14 and is positioned immediately before the second reflective optical element 14.2, this description only serves as an example, as many equivalent positions in the EUV lithography apparatus 1, i.e. positions where the above-described requirements are fulfilled, can be found. Such equivalent positions include vacuum separation valves between vacuum compartments in the vacuum vessel 2, aperture stops arranged in the illumination system 4 (e.g. the so-called sigma blade), as well as the reticle plane 11, or the wafer plane 16. At all of these positions, various assemblies are brought into the optical path by a dedicated handling mechanism to make a dedicated imaging possible without breaking/disturbing the vacuum conditions in the vacuum vessel 2. The sample elements can be positioned on irradiated areas of these moving assemblies which are shadowing the optical path 15.

Figure 2A:
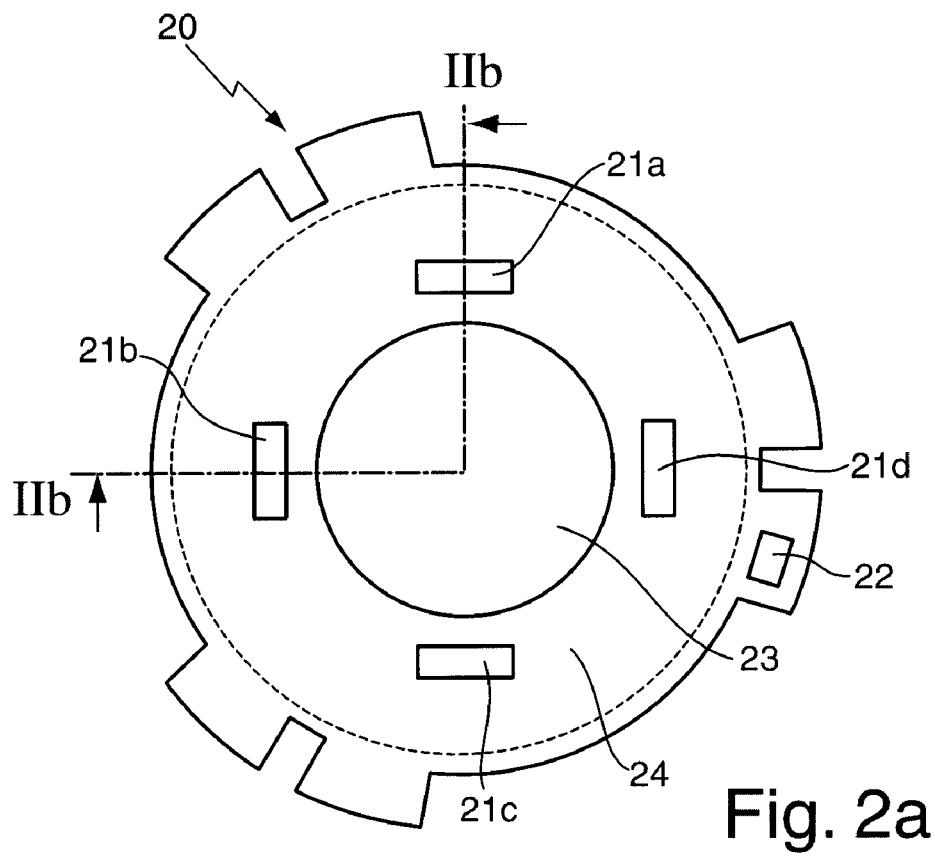
FIGS. 2a, 2b show the aperture stop of FIG. 1 in a top view (FIG. 2a) and a longitudinal section (FIG. 2b)
Figure 2B:
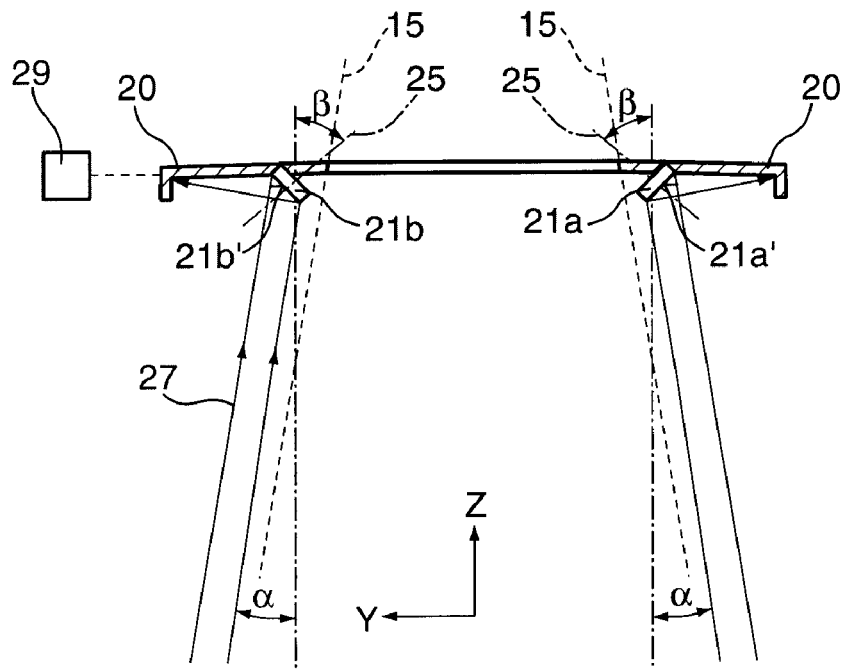
Figure 3A:
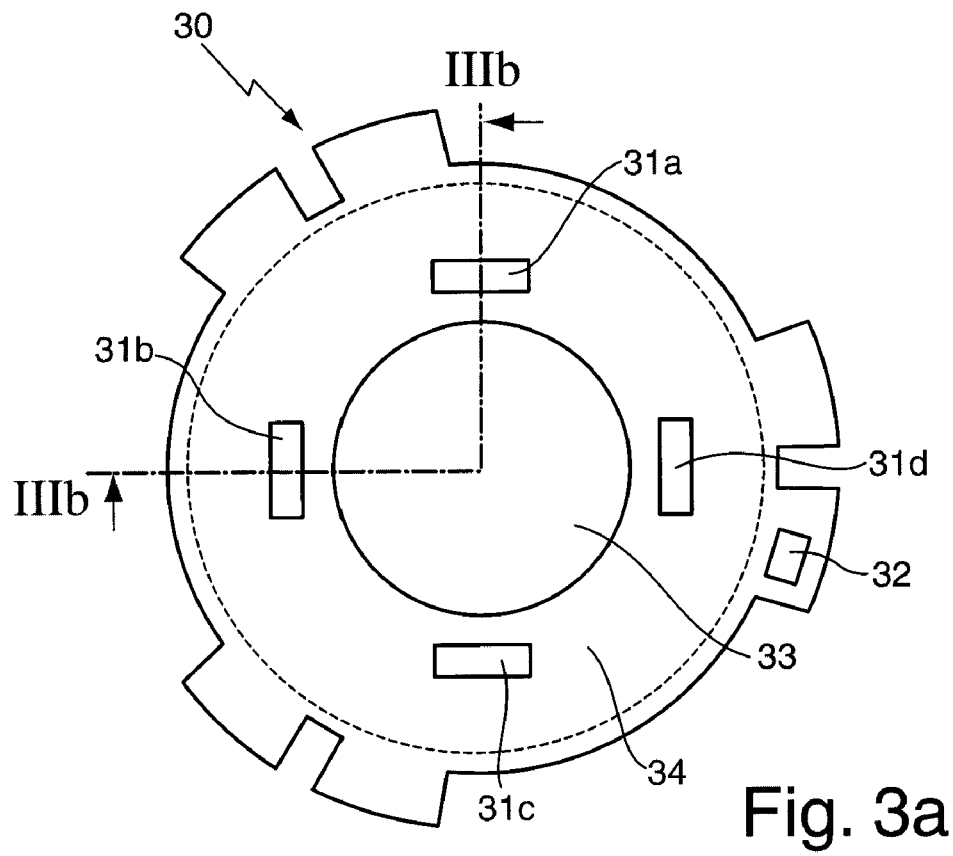
FIGS. 3a, 3b show an alternative realization of an aperture stop for the exposure apparatus of FIG. 1 in a top view (FIG. 3a) and a longitudinal section (FIG. 3b).
Figure 3B:
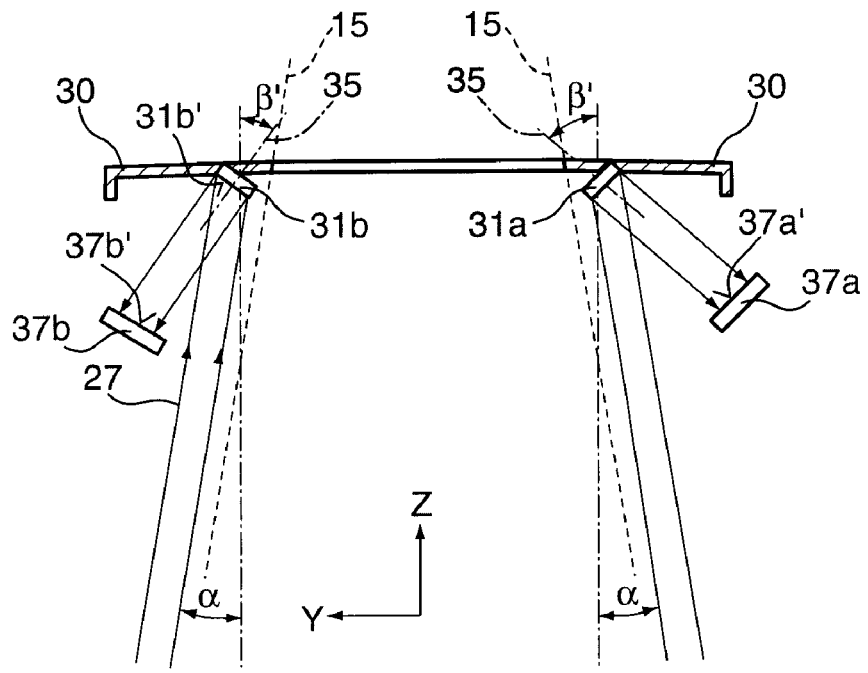

FIG. 3a,b show an aperture stop 30 of a similar construction as the aperture stop 20 of FIG. 2a,b, like elements of which are designated by reference numerals of FIG. 2a,b increased by ten. The aperture stop 30 of FIG. 3a,b comprises sample elements 31a to 31d the normal vectors 35 of which form an angle $\beta'=40°$ with respect to the z-axis which is small enough so that the EUV radiation 27 incident to the optical surfaces 31a' to 31d' of the sample elements 31a to 31d is reflected to four corresponding detection units (two of which 37a, 37b along the y-axis are shown in FIG. 3b) for measuring the intensity of the reflected EUV radiation. The detection units 37a, 37b allow for determining the contamination status of the sample elements 31a, 31b by calculating the reflectivity of their optical surfaces 31a', 31b' based on the intensity of the reflected radiation impinging on detection surfaces 37a', 37b' of the detection units 37a, 37b. As the detection surfaces 37a', 37b' are absorptive for the reflected EUV radiation, the detection units 37a, 37b serve as a light trap such that no radiation can return to the optical path 15. The detection units 37a, 37b are arranged on suitable holders inside the EUV exposure apparatus 1 and remain at their positions also when the aperture stop 30 is replaced. It is understood that alternatively, the detection units 37a, 37b may also be arranged on the aperture stop 30 when the tilting angle of the sample elements 31a to 31d is adjusted accordingly.

With the arrangements shown in FIG. 2a,b and FIG. 3a,b an online inspection of the contamination status of the sample surfaces 21a to 21d and 31a to 31d, respectively, is possible. The person skilled in the art will appreciate that alternatively or in addition, detection units for online determination of the contamination status based on alternative detection methods may be arranged in the EUV projection exposure apparatus 1 as well. It is understood that the detection units may be in operative connection with a control unit of the exposure apparatus 1 which is designed to start a cleaning cycle for cleaning the optical elements 14.1 to 14.6 as soon as a pre-defined threshold value of the contamination on the sample elements 21a to 21d, 31a to 31d is attained.

The above description of the preferred embodiments has been given by way of example. From the disclosure given, those skilled in the art will not only understand the present invention and its attendant advantages, but will also find apparent various changes and modifications to the structures and methods disclosed. The applicant seeks, therefore, to cover all such changes and modifications as fall within the spirit and scope of the invention, as defined by the appended claims, and equivalents thereof.

The invention claimed is:

1. Optical system for radiation in the EUV wavelength range, having at least one vacuum vessel,
   wherein said vacuum vessel comprises:
   at least one EUV-reflective optical element arranged in an optical path, and
   a holder which comprises at least one sample element, said sample element having an optical surface which is exposed to incident EUV-radiation outside of the optical path, said sample element being sensitive to chemical alterations under influence of the incident EUV-radiation which also affect said optical element,
   wherein the optical system further comprises at least one detection unit for detection of the contamination status of said sample element during exposure of said sample element to the incident EUV-radiation.

2. Optical system according to claim 1,
   wherein said holder is electrically conductive, and said sample element is electrically conductively connected to said holder.

3. Optical system according to claim 2, wherein said holder is in operable connection with said detection unit for measuring a photoelectron current due to the incident EUV-radiation.

4. Optical system according to claim 3, wherein said detection unit comprises at least one of a voltage meter and a current measuring device.

5. Optical system according to claim 1, wherein the optical surface reflects all of the incident EUV-radiation to said detection unit for measuring intensity of the reflected EUV-radiation.

6. Optical system according to claim 1, wherein all of the EUV-radiation incident on the optical surface is absorbed by at least one of said holder and said sample element.

7. Optical system according to claim 1, wherein said optical surface reflects all of the incident EUV-radiation to said holder.

8. Optical system according to claim 1, wherein said optical surface absorbs all of the incident EUV-radiation.

9. Optical system according claim 1, wherein said sample element is detachably attached to said holder.

10. Optical system according claim 9, wherein said sample element is detachably clamped to said holder.

11. Optical system according to claim 1, wherein said holder is removable from said vacuum vessel without perturbing vacuum conditions of said vacuum vessel.

12. Optical system according to claim 11, further comprising at least one of a dedicated handling mechanism, a sample transfer, or a load lock arranged to remove said holder from said vacuum vessel without perturbing the vacuum conditions of said vacuum vessel.

13. Optical system according to claim 1, wherein said sample element is positioned under a tilt angle with respect to the incident radiation.

14. Optical system according to claim 1, wherein said sample element comprises a multilayer coating with a structure corresponding to a structure of a multilayer coating of said at least one EUV-reflective optical element.

15. Optical system according to claim 1, wherein said holder is selected from the group consisting of: a vacuum separation valve and an aperture stop.

16. Optical system according to claim 1, wherein said sample element is located in one of a wafer plane, a reticle plane, an aperture plane of the optical system, or at vacuum separation valves between vacuum compartments in the vacuum vessel.

17. Optical system according to claim 1, further comprising at least one reference sample element which is not exposed to the EUV-radiation.

18. Optical system according to claim 17, wherein said reference sample element is arranged outside an irradiated area on said holder.

* * * * *